(12) United States Patent
Kim

(10) Patent No.: US 6,893,982 B2
(45) Date of Patent: May 17, 2005

(54) METHOD FOR FORMING A THIN FILM, METHODS FOR FORMING A GATE ELECTRODE AND TRANSISTOR USING THE SAME, AND A GATE ELECTRODE MANUFACTURED USING THE SAME

(75) Inventor: Sung-Eui Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 107 days.

(21) Appl. No.: 10/337,298

(22) Filed: Jan. 7, 2003

(65) Prior Publication Data

US 2004/0009677 A1 Jan. 15, 2004

(30) Foreign Application Priority Data

Jul. 9, 2002 (KR) ........................................ 2002-39817

(51) Int. Cl.$^7$ ............................................. H01L 21/31
(52) U.S. Cl. ...................... 438/778; 438/770; 438/775; 438/764
(58) Field of Search ................................ 438/764, 770, 438/775, 778

(56) References Cited

U.S. PATENT DOCUMENTS

| 5,706,164 | A | | 1/1998 | Jeng |
| 5,710,454 | A | | 1/1998 | Wu |
| 6,291,275 | B1 | * | 9/2001 | Yamazaki et al. ........... 438/151 |
| 6,407,431 | B2 | * | 6/2002 | Yamazaki et al. ........... 257/353 |

* cited by examiner

Primary Examiner—David Nelms
Assistant Examiner—Renee R. Berry
(74) Attorney, Agent, or Firm—Harness, Dickey & Pierce, P.L.C.

(57) ABSTRACT

A method for forming a thin film on a gate electrode reduces oxidation of the gate electrode during a re-oxidation process to fix the damage to the gate oxide film caused during the formation of the gate electrode pattern. The gate electrode pattern formed in this manner will have reduced defects after re-oxidation. After a gate oxide film is formed on a substrate, a gate electrode pattern is formed on the gate oxide film through an etching process. A thin film that includes nitride is then continuously formed on the gate oxide film and on the gate electrode by utilizing a deposition rate difference between the thin film on the gate oxide film and on the thin film forming the gate electrode. Because of the thin film formed on the gate electrode, oxidation of the gate electrode is reduced during the re-oxidation of the gate oxide film.

34 Claims, 8 Drawing Sheets

METHOD FOR FORMING A THIN FILM, METHODS FOR FORMING A GATE ELECTRODE AND TRANSISTOR USING THE SAME, AND A GATE ELECTRODE MANUFACTURED USING THE SAME

CROSS-REFERENCE TO RELATED APPLICATIONS

This non-provisional application claims priority under 35 U.S.C. §119 to Korean Patent Application No. 2002-39817 filed Jul. 9, 2002, the contents of which are incorporated herein by reference in its entirety.

BACKGROUND OF THE INVENTION

1. Field of the Invention

The present invention relates generally to methods for forming a thin film, a gate electrode, and a transistor, and a gate electrode formed by these methods, and more particularly to a method for forming a thin film that includes nitride on a gate electrode pattern that has a polycide structure, a method for forming a gate electrode that can reduce oxidation of the gate electrode during a re-oxidation process, a method of forming a transistor that has a lightly doped drain structure, and a gate electrode that does not contain any defects after a re-oxidation process.

2. Description of the Related Art

Semiconductor devices have been developed to have high integration densities. As a result, the sizes of the patterns formed on a semiconductor substrate and the intervals between the patterns have been greatly reduced. In the past, polysilicon was widely employed as the wiring material for forming a gate electrode or a bit line. However, because polysilicon has a high specific resistance, a gate electrode formed of polysilicon has disadvantages such as an RC time delay and an IR voltage drop in accordance with the reduction in the sizes of the patterns on the substrate. A polycide having characteristics similar to those of a polysilicon has been used as the wiring material in a gate electrode or a bit line in very large scale integration (VLSI) circuits because the polycide has a specific resistance several times lower that that of polysilicon. The polycide has the composite structure of polysilicon and a refractory metal silicide.

The metal silicide includes a refractory metal, such as, for example, tungsten (W), molybdenum (Mo), titanium (Ti), or tantalum (Ta). Such a metal silicide is used as a low resistance wiring material in the formation of the VLSI circuit. The metal silicide is coupled to a polysilicon doped with a high concentration to be used for forming a gate electrode.

When a polycide structure is employed for the gate electrode, it is difficult to perform a re-oxidation process to fix the damage to a gate oxide film and a semiconductor substrate after the formation of the gate electrode because the refractory metal in the metal silicide is oxidized during the re-oxidation process. Examples of gate electrodes having polycide structures are disclosed in U.S. Pat. No. 5,706,164 (issued to Jeng) and U.S. Pat. No. 5,710,454 (issued to Wu).

FIG. 1 is cross-sectional view illustrating a gate electrode formed according to a conventional method. After forming a gate oxide film 102 on a semiconductor substrate 100, a polysilicon layer, a metal silicide layer, and a silicon nitride layer are subsequently formed on the gate oxide film 102. The polysilicon layer, the metal silicide layer and the silicon nitride layer are then patterned via a photolithography process to form a gate electrode 10 having a polysilicon pattern 104, a metal silicide pattern 106, and a silicon nitride pattern 108.

When performing a re-oxidation process, the metal silicide is oxidized and defects such as abnormal oxidation or the metal silicide deforming into the shape of an ear (A) may occur. The ear-shaped defect of the metal silicide (A) may deteriorate the operation of the gate electrode 10 and may reduce the margin for filling the gap between the gate electrodes 10. Therefore, a void between the gate electrodes 10 may occur when the space between the gate electrodes is filled with an insulation material such as silicon oxide.

To overcome the above-mentioned problems, the gate electrode is thermally treated at a temperature of at least 900° C. When the gate electrode is treated at such a high temperature, abnormal oxidation of the gate electrode can be somewhat reduced. However, this high temperature treatment for the gate electrode may introduce a fatal failure in the operation of a transistor having a short channel structure or a lightly doped drain (LDD) structure. Thus, it is difficult to form a gate electrode having a polycide structure without defects.

SUMMARY OF THE INVENTION

One exemplary embodiment of the present invention provides a method for forming a thin film for use in a gate electrode having a polycide structure.

Another exemplary embodiment of the present invention provides a method for forming a gate electrode that can reduce oxidation of the gate electrode during a re-oxidation process.

A further exemplary embodiment of the present invention provides a method for forming a transistor having a lightly doped drain structure.

Another exemplary embodiment of the present invention provides a gate electrode that does not contain any defects after a re-oxidation process.

In at least one exemplary embodiment of the present invention, a method for forming a thin film of a semiconductor device is provided that includes forming a first thin film pattern that includes an oxidative material on an oxide film and continuously forming a second thin film that includes a nitride on the first thin film pattern and on the oxide film. The second thin film is formed by utilizing a deposition rate difference of the second thin film on the first thin pattern and second thin film on the oxide film so that the second thin film is selectively formed on the first thin film pattern and on the oxide film.

In at least one exemplary embodiment of the present invention, a method for forming a gate electrode of a semiconductor device is provided that includes forming a gate oxide film on a substrate; successively forming a polysilicon film, a metal silicide film, and a silicon nitride film on the gate oxide film; successively etching the polysilicon film, the metal silicide film, and the silicon nitride film to form a gate electrode pattern on the gate oxide film; continuously forming a thin film that includes nitride on the gate oxide film and on the gate electrode pattern; and fixing any damage of the gate oxide film that was caused during the formation of the gate electrode pattern by re-oxidizing the gate oxide film. In at least one exemplary embodiment of the present invention, the thin film is deposited by using a deposition rate difference between the thin film to the gate oxide film and the thin film on the gate electrode pattern so that the thin film is selectively formed on the gate oxide film and on the gate electrode pattern.

In at least one other exemplary embodiment of the present invention, a method for forming a transistor of a semiconductor device is provided that includes forming a gate oxide film on a substrate; successively forming a polysilicon film, a metal suicide film, and a silicon nitride film on the gate oxide film; successively etching the polysilicon film, the metal silicide film, and the silicon nitride film to form a gate electrode on the gate oxide film; forming a primarily source/ drain electrode at the portion of the substrate adjacent to the gate electrode by performing an ion implantation using the gate electrode as a mask; continuously forming a thin film that includes nitride on the gate oxide film and on the gate electrode; fixing any damage to the gate oxide film caused during the formation of the gate electrode by re-oxidizing the gate oxide film; forming a spacer on a sidewall of the gate electrode; and forming a source/drain electrode having a lightly doped drain structure at the portion of the substrate adjacent to the spacer by performing an ion implantation using the spacer as a mask. The thin film is deposited on the gate oxide film by utilizing a deposition rate difference between the thin film on the gate oxide film and the thin film on the gate electrode so that the thin film is selectively formed on the gate oxide film and on the gate electrode.

In at least one exemplary embodiment of the present invention, a gate electrode of a semiconductor device is provided that includes a substrate having a gate oxide film formed thereon, a gate electrode pattern that includes polysilicon and metal silicide formed on the gate oxide film, and a thin film that includes nitride formed on the gate oxide film. The thin film is formed by utilizing a deposition rate difference between the thin film on the gate oxide film and the thin film on the gate electrode pattern so that the thin film is selectively formed on the gate oxide film and on the gate electrode pattern.

According to at least one exemplary embodiment of the present invention, a thin film that includes nitride is formed on a pattern that includes polysilicon and metal silicide that can be reacted with oxygen. Therefore, oxidation of the pattern during a re-oxidation process can be reduced due to the thin film including nitride.

BRIEF DESCRIPTION OF THE DRAWINGS

Exemplary embodiments of the present invention will become readily apparent by reference to the following detailed description when considered in conjunction with the accompanying drawings wherein.

DETAILED DESCRIPTION OF THE PREFERRED EMBODIMENTS

Figure 1:
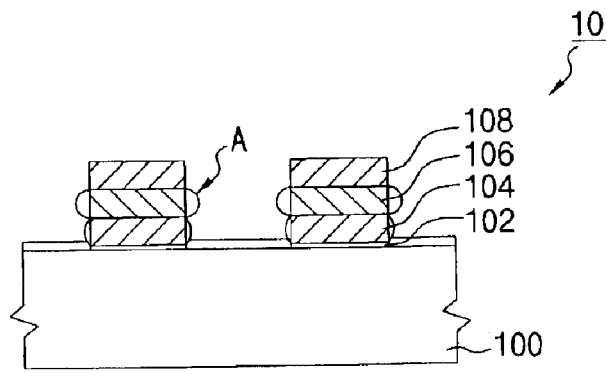
FIG. 1 is a cross-sectional view illustrating a gate electrode formed according to a conventional method.

Hereinafter, exemplary embodiments of the present invention will be described in detail with reference to the attached drawings. However, the exemplary embodiments of the present invention can be modified into various other forms, and the scope of the present invention must not be interpreted as being restricted to the embodiments. The exemplary embodiments are provided to more completely explain the present invention to those skilled in the art. In drawings, the thicknesses of layers or regions are exaggerated for clarity. Like reference numerals in the drawings denote the same members. Also, when it is written that a layer is formed "on" another layer or a substrate, the layer can be formed directly on the other layer or the substrate, or other layers can intervene therebetween.

A method for forming a thin film will be described below. A first thin film that includes a material which can be reacted with oxygen (e.g., silicon, a metal, or a metal compound) is formed on an oxide film. Suitable examples of the material include polysilicon, silicon nitride, and a metal silicide. As a result, the first thin film pattern may include a polysilicon pattern, a metal silicide pattern, or a silicon nitride pattern. Although the first thin film pattern can be a polysilicon pattern, a metal silicide pattern, and/or a silicon nitride pattern, the first thin film pattern is preferably a polysilicon pattern, a metal silicide pattern, and a silicon nitride pattern successively formed on the oxide film.

After the first thin film is formed on the oxide film, the first thin film is partially etched to form the first thin film pattern. Therefore, the first thin film pattern is formed on a portion of the oxide film.

Next, a second thin film that includes a nitride (e.g., silicon nitride) is continuously formed on the first thin film pattern and on the oxide film. The formation of the second thin film is achieved due to the difference between the deposition rate of the second thin film on the first thin film pattern and the deposition rate of the second thin film on the oxide film. In particular, the deposition rate of the second thin film on the oxide film is slower than that of the second thin film on the thin film that includes silicon. As a result, the second thin film is selectively formed on the first thin film pattern and on the oxide film such that the second thin film can be formed only on the first thin film pattern. In addition, a first thickness of the second thin film on the first thin film pattern is thicker than a second thickness of the second thin film on the oxide film in accordance with the selective formation of the second thin film on the first thin film pattern and the oxide film and the difference in deposition rates.

The selective formation of the second thin film can be performed in an airtight apparatus. For example, the selective formation of the second thin film can be performed in a deposition apparatus having a load rock chamber. Additionally, the selective formation of the second thin film can be performed through a rapid thermal process (RTP). The second thin film can be formed using nitrogen gas, ammonia gas or a mixture of nitrogen gas and ammonia gas.

Experimental examples for the selective formation of a silicon nitride film on a silicon film and on an oxide film will now be described. In the following examples, the silicon nitride film corresponds to the above-mentioned second thin film.

Figure 2:
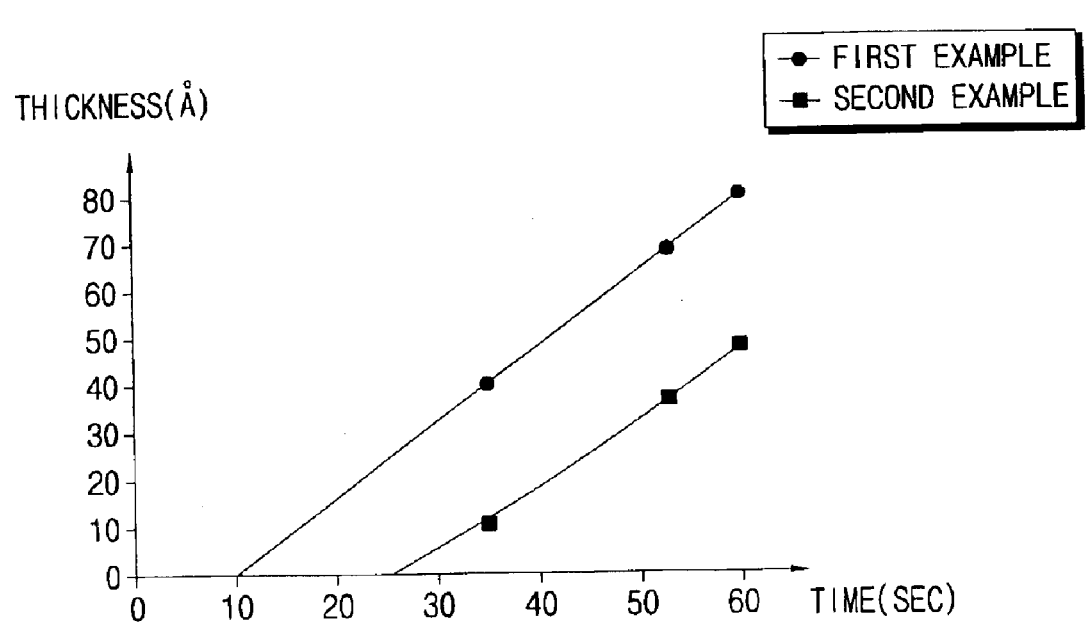
FIG. 2 is a graphical illustration depicting the deposition rates of the silicon nitride film on the silicon film and the oxide film according to an exemplary embodiment of the present invention.

Referring to FIG. 2, a graph showing the deposition rates of the silicon nitride film on the silicon film and the oxide film can be seen. In particular, the first example represents the deposition rate of the silicon nitride film on the silicon film and the second example represents the deposition rate of the silicon nitride film on the oxide film. In these examples, the silicon nitride film was formed with the airtight deposition apparatus by a rapid thermal process.

In the first example, the formation of the silicon nitride film on the silicon film can be seen after approximately 10 seconds from the start of the process. On the other hand, in the second example, the formation of the silicon nitride film on the oxide film can be seen after approximately 25 seconds from the start of the process. Therefore, the deposition of the silicon nitride film on the oxide film occurs after the deposition of the silicon nitride film on the silicon film has started. In particular, when the deposition of the silicon nitride on the oxide film is seen (i.e., about 25 seconds from the start of the process), the silicon nitride film on the silicon film has a thickness of approximately 25 Å. In addition, when the silicon nitride film formed on the oxide film has a thickness of approximately 10 Å, the silicon nitride film deposited on the silicon film has the thickness of approximately 40 Å.

According to the above-described examples, the second thin film can be formed only on the first thin film pattern. In the examples shown in FIG. 2, when the second thin film is formed only on the first thin film pattern, the second thin film has a thickness up to 25 Å. The second thin film is deposited for a time period of approximately 10 to 25 seconds. However, depending on the composition of the first thin film pattern, the oxide film, the second thin film, and the deposition rates of the second thin film on the first thin film pattern and on the oxide film, the second thin film can be deposited only on the first thin film pattern (and not on the oxide film) to a thickness of approximately 10 to 50 Å. The time period for the formation of the second thin film is preferably from approximately 10 to 50 seconds.

In addition, the first thickness of the second thin film on the first thin film pattern can be greater than the second thickness of the second thin film on the oxide film. In this case, the first thickness is greater than the second thickness by approximately two to five times. The second thickness of the second thin film on the oxide film is preferably approximately 10 to 15 Å when the first thickness of the second thin film on the first thin film pattern is approximately 50 Å. The formation of the second thin film is preferably performed for approximately 10 to 50 seconds.

Further, the oxide film can be damaged when the first thin film pattern is formed. To correct the damage done to the oxide film, the oxide film is re-oxidized after the second thin film is selectively formed. Because the second thin film is positioned on the first thin film pattern, the first thin film pattern may not be affected by the re-oxidation of the oxide film. Therefore, failures such as an abnormal oxidation which is frequently caused by the re-oxidation of the oxide film can be reduced.

The selective formation of the second thin film as described above can be effectively employed for forming a gate electrode. In this regard, a method for forming a gate electrode will now be described.

FIGS. 3A to 3F are cross-sectional views illustrating a the formation of a gate electrode according to a method of an exemplary embodiment of the present invention.

Figure 3A:
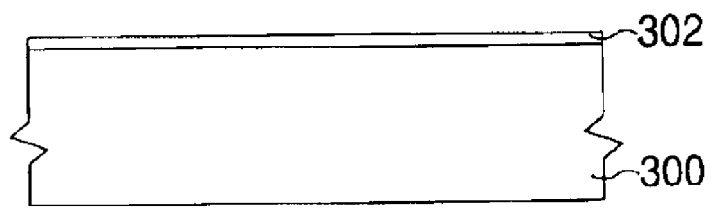
FIGS. 3A to 3F are cross-sectional views illustrating the formation of a gate electrode according to a method of an exemplary embodiment of the present invention.
Figure 3B:
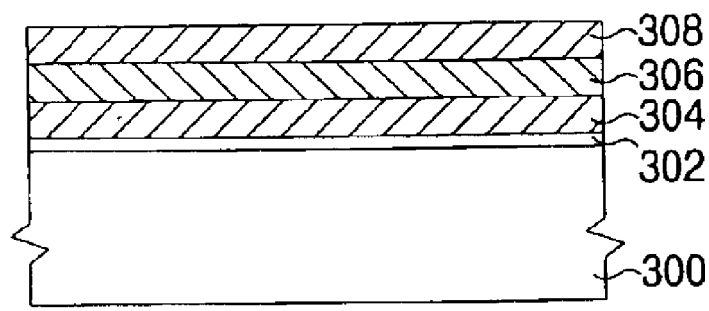

As can be seen in FIG. 3A, a gate oxide film 302 is formed on a substrate 300. The gate oxide film 302 can be formed through a rapid thermal oxidation process. A polysilicon film 304, a metal silicide film 306 and a silicon nitride film 308 are successively formed on the gate oxide film 302. (FIG. 3B). The metal silicide film 306 includes tungsten (W) silicide, molybdenum (Mo) silicide, titanium (Ti) silicide, or tantalum (Ta) silicide. Although the metal silicide film 306 may include at least two of the above-mentioned metal silicides, the metal silicide film preferably includes only one of the above-mentioned metal silicides.

Figure 3C:
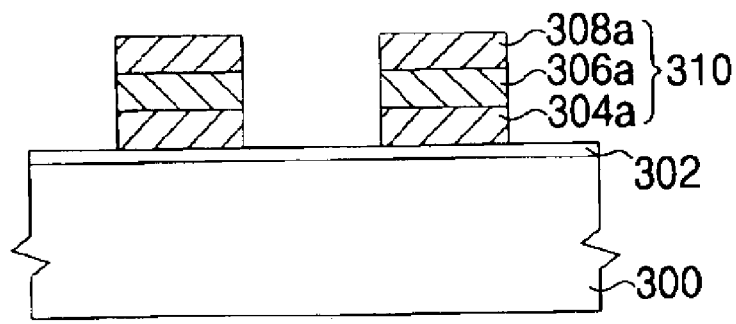

Referring to FIG. 3C, the silicon nitride film 308, the metal silicide film 306, and the polysilicon film 304 are successively etched by a photolithography process, thereby forming a gate electrode pattern 310 that includes a polysilicon pattern 304a, a metal silicide pattern 306a, and a silicon nitride pattern 308a.

Figure 3D:
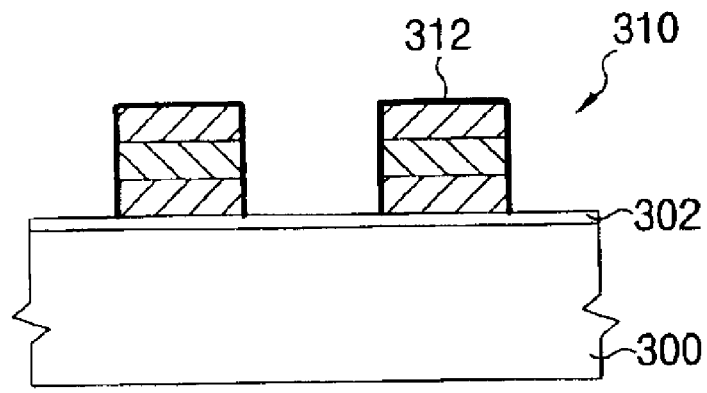

Referring now to FIG. 3D, a silicon nitride film 312 is continuously formed on the gate oxide film 302 and on the gate electrode pattern 310. The silicon nitride film 312 is formed using the deposition rate difference between the silicon nitride film 312 on the gate oxide film 302 and the silicon nitride film 312 on the gate electrode pattern 310. Because the silicon nitride film 312 is formed on the gate electrode pattern 310 more quickly than the silicon nitride film 312 is formed on the gate oxide film 302, the silicon nitride film 312 can be formed only on the gate electrode pattern 310. In addition, the thickness of the silicon nitride film 312 on the gate electrode pattern 310 can be greater than the thickness of the silicon nitride film 312 on the gate oxide film 302. Preferably, the thickness of the silicon nitride film 312 on the gate oxide film 302 is approximately 10 Å when the thickness of the silicon nitride film 312 on the gate electrode pattern 310 is approximately 50 Å. When the silicon nitride film 312 has a thickness of approximately 10 Å on the gate oxide film 302, the gate oxide film 302 can be re-oxidized without the obstruction of the silicon nitride film 312.

Figure 3E:
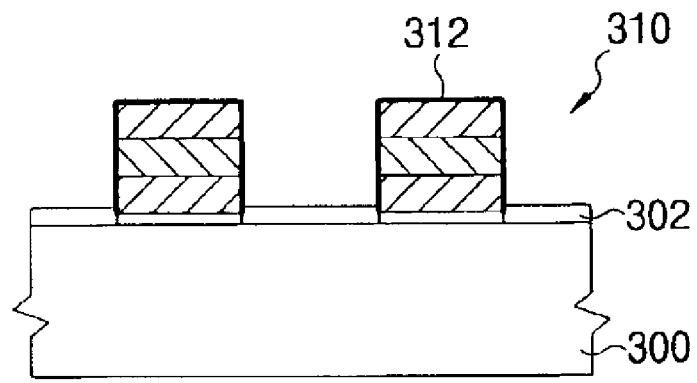

The gate oxide film 302 is then re-oxidized to fix any damage to the gate oxide film 302 caused by the formation of the gate electrode pattern 310. As can be seen in FIG. 3E, because the silicon nitride film 312 is positioned on the gate electrode pattern 310, the gate electrode pattern 310 cannot be oxidized during the re-oxidation of the gate oxide film 302. As a result, abnormal oxidation and/or deterioration of the gate electrode pattern 310 is reduced and the margin for filling the gap between the gate electrode patterns 310 is sufficiently ensured.

Figure 3F:
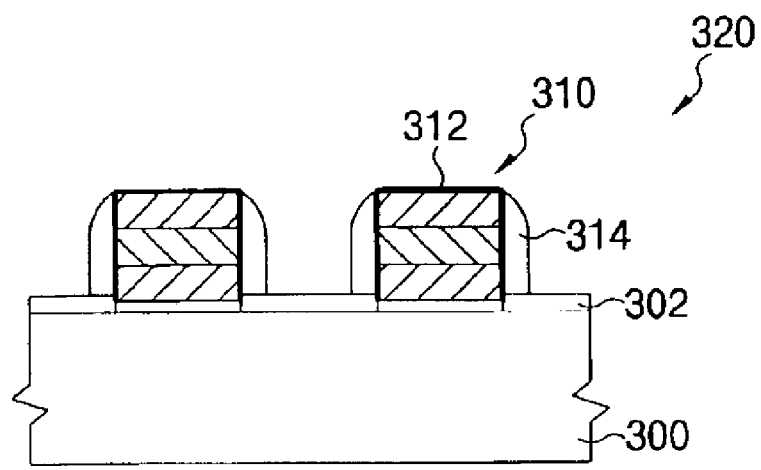

Referring to FIG. 3F, a spacer 314 is formed on the sidewall of the gate electrode pattern 310, thereby completing the gate electrode 320. The spacer 314 is formed by etching the silicon nitride film after the silicon nitride film is coated on the whole surface of the substrate 300 including the gate electrode pattern 310. The gate electrode 320 includes the gate oxide film 302 formed on the substrate 300, the gate electrode pattern 310 formed on the gate oxide film 302, the silicon nitride film 312 selectively formed on the gate electrode pattern 312, and the spacer 314 formed on the sidewall of the gate electrode pattern 310. The gate electrode pattern 310 includes the polysilicon pattern 304a, the metal silicide pattern 306a, and the silicon nitride pattern 308a.

As described above, the silicon nitride film 312 is selectively formed on the gate electrode pattern 310 in order to reduce abnormal oxidation of the gate electrode pattern 310 during the re-oxidation of the gate oxide film 302. To reduce the oxidation of a gate electrode, various methods are used. Examples for forming a thin film on the gate electrode pattern are disclosed in Korean Laid Open Patent Publication No. 199-57939, Korean Laid Open Patent Publication No. 2000-40109, and U.S. Patent Publication No. 2001/0025971.

According to Korean Laid Open Patent Publication No. 1999-57939, a gate electrode pattern and a gate oxide film are nitrified through a thermal process under an oxy-nitride gas atmosphere. In Korean Laid Open Patent Publication No. 2000-40109, a nitride film is formed on the sidewall of a gate electrode pattern through a thermal process. A passivation film is formed on the sidewall of a gate electrode pattern using an ammonia ($NH_3$) gas according to U.S. Patent Publication No. 2001/0025971. According to the above-mentioned Patent Publications, the thin film formed on the gate electrode pattern can be obtained through the nitrification of the gate electrode pattern without the formation of the thin film on the gate electrode pattern.

In the present invention, however, the thin film (e.g., the silicon nitride film 312) is directly coated on the gate electrode pattern 310. Therefore, the deposition mechanism of the thin film of the present invention is different from those disclosed in the above-mentioned Patent Publications.

There is a method for first forming a silicon nitride film on the sidewall of a gate electrode after the silicon nitride film is formed on the gate electrode pattern and on the gate oxide film and then entirely etching the silicon nitride film. However, in this method, the gate oxide may be damaged during the etching of the silicon nitride film.

The method for forming the gate electrode can be effectively employed for forming a transistor including the above-described gate electrode. In this regard, a method for forming a transistor will now be described. In particular, FIGS. 4A to 4G are cross-sectional views illustrating the formation of a transistor according to an exemplary embodiment of the present invention.

Figure 4A:
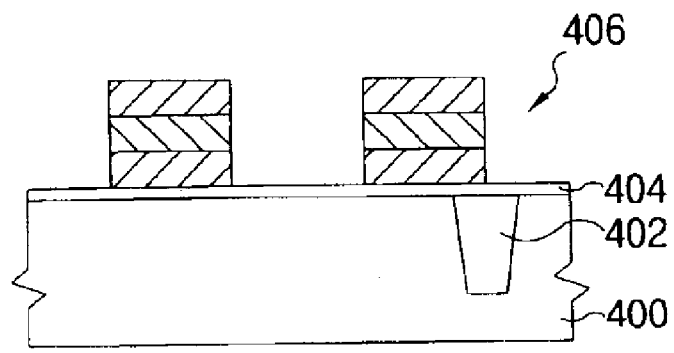
FIGS. 4A to 4H are cross-sectional views illustrating the formation of a transistor according to a method of an exemplary embodiment of the present invention.

Referring first to FIG. 4A, a substrate 400 is divided into an active region and a field region through an isolation process. The isolation of the substrate 400 is accomplished by forming a trench structure 402 in the substrate 400. After a gate oxide film 404 is formed on the substrate 400, a gate electrode 406 is formed on the gate oxide film 404. The gate electrode 406 is formed in accordance with the method for forming the gate electrode described above. Thus, the gate electrode 406 includes a polysilicon pattern, a metal silicide pattern, and a silicon nitride pattern.

Figure 4B:
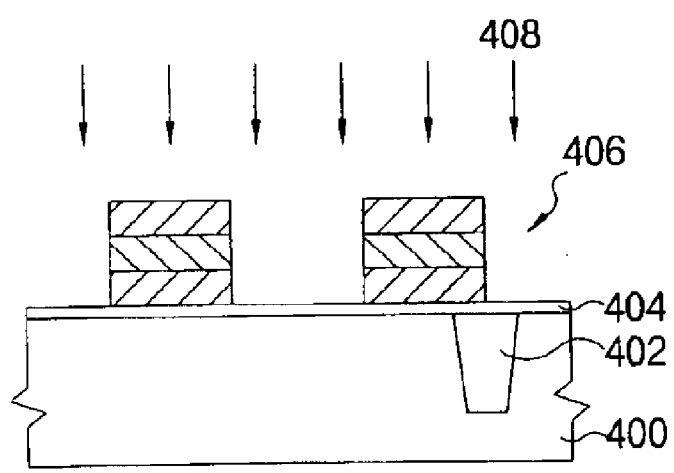
Figure 4C:
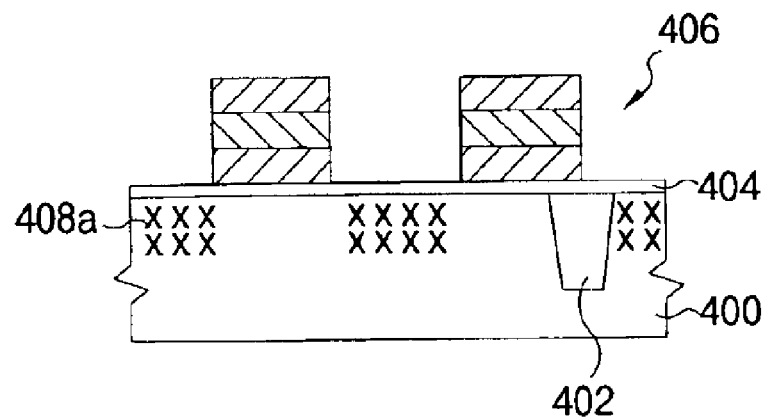

As shown in FIG. 4B, impurities 408 are implanted into the substrate 400 using the gate electrode 406 as a mask. As a result, a primary source/drain electrode 408a is formed at the portions of the substrate 400 adjacent to the gate electrodes 406, as can be seen in FIG. 4C.

Figure 4D:
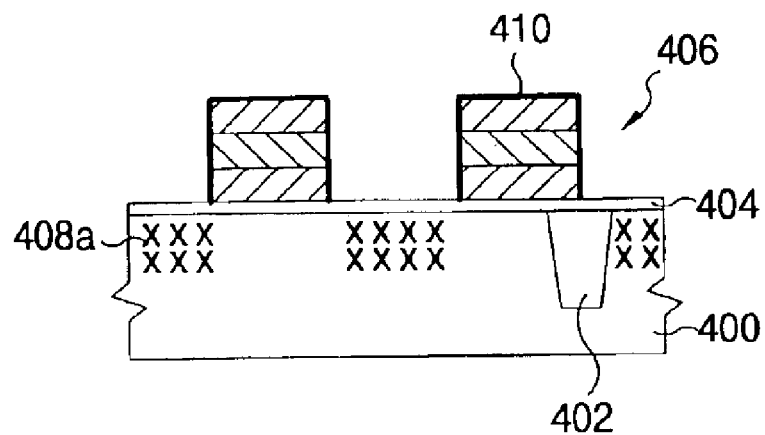

Referring to FIG. 4D, a silicon nitride film 410 is formed on the gate electrode 406 by the method described above for forming a silicon nitride film. Thus, the silicon nitride film 410 is selectively formed only on the gate electrode 406.

Figure 4E:
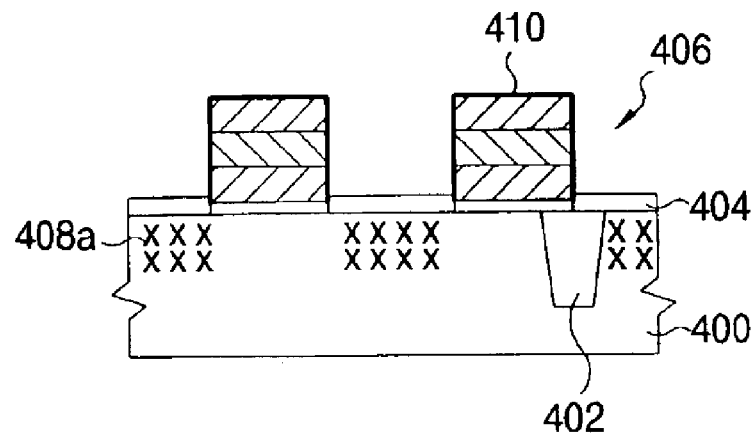

The gate oxide film 404 is re-oxidized to fix any damage to the gate oxide film 404 caused by the etching process in forming the gate electrode 406. Because the silicon nitride film 410 is positioned on the gate electrode 406, as shown in FIG. 4E, the gate electrode 406 is not oxidized during the re-oxidation of the gate oxide film 404. Therefore, any abnormal oxidation of the gate electrode 406 that might occur during the re-oxidation of the gate oxide film 404 is reduced.

Figure 4F:
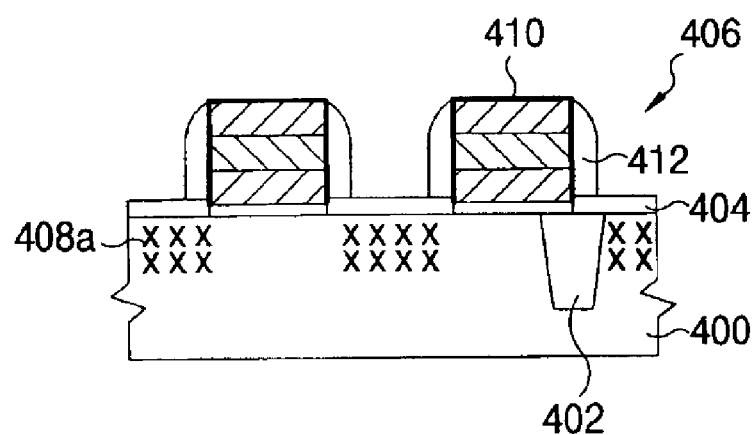

As shown in FIG. 4F, a spacer 412 is formed on the sidewall of the gate electrode 406. The spacer 412 can be formed by the method for forming a spacer as described above.

Figure 4G:
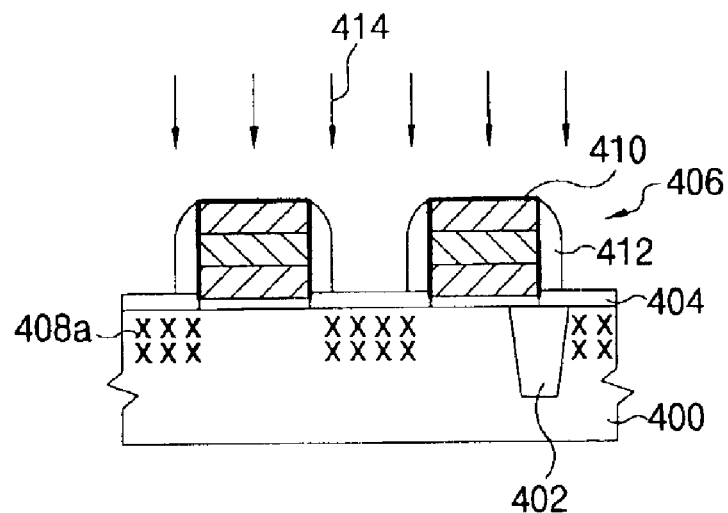
Figure 4H:
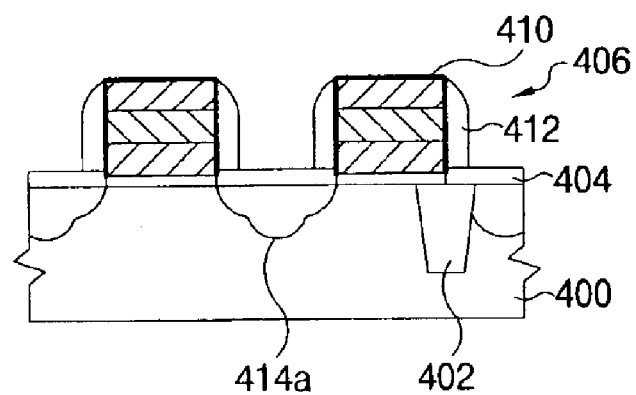

Referring now to FIG. 4G, impurities 414 are implanted into the substrate 400 using the gate electrode 406 and the spacer 412 as masks. As a result, a electrode 414a having a lightly doped drain (LDD) structure is formed at the portion of the substrate 400 adjacent to the spacer 412, as can be seen in FIG. 4H. Therefore, a transistor that includes the gate electrode 406 and the source/drain electrode 414a is formed on the substrate 400.

As described above, oxidation of the gate electrode can be effectively prevented during the re-oxidation of the gate oxide film. Therefore, a transistor that includes a gate electrode operates effectively, and the margin for filling the gap between the gate electrodes is sufficiently ensured. As a result, the reliability of a semiconductor device having such a transistor is improved.

Having described the exemplary embodiments of the present invention, it is noted that modifications and variations can be made by persons skilled in the art in light of the above teachings. It is therefore to be understood that changes may be made in the particular exemplary embodiments of the present invention disclosed herein which is within the scope and the spirit of the invention as outlined by the appended claims.

What is claimed is:

1. A method for forming a thin film on a semiconductor device comprising the steps of:
   forming a first thin film pattern that includes at least one oxidative material on an oxide film; and
   depositing a second thin film that includes nitride on the first thin film pattern and on the oxide film,
   wherein the second thin film is selectively formed on the first thin film pattern and on the oxide film, and the second thin film on the oxide film has a deposition rate slower than that of the second thin film on the first thin film pattern.

2. The method of claim 1, wherein the step of forming the first thin film pattern comprises the steps of:
   forming a first thin film on the oxide film; and
   partially etching the first thin film to form the first thin film pattern on the oxide film.

3. The method of claim 1, further comprising the step of re-oxidizing the oxide film to cure damage to the oxide film caused during the formation of the first thin film pattern after the step of forming the second thin film.

4. The method of claim 3, wherein the second thin film is formed only on the first thin film pattern.

5. The method of claim 4, wherein the formation of the second thin film on the first thin film pattern protects the first thin film pattern from oxidation during the step of re-oxidizing the oxide film.

6. The method of claim 1, wherein the oxidative material is a member selected from the group consisting of silicon, a metal and a metal compound.

7. The method of claim 6, wherein the oxidative material is selected from the group consisting of polysilicon, silicon nitride and metal silicide.

8. The method of claim 1, wherein the first thin film pattern includes at least one member selected from the group consisting of a polysilicon pattern, a metal silicide pattern and a silicon nitride pattern.

9. The method of claim 8, wherein the first thin film pattern successively includes the polysilicon pattern, the metal silicide pattern, and the silicon nitride pattern.

10. The method of claim 8, wherein the second thin film includes silicon nitride.

11. The method of claim 1, wherein the second thin film is formed only on the first thin film pattern.

12. The method of claim 11, wherein the second thin film has a thickness of approximately 10 to 50 Å.

13. The method of claim 11, wherein the second thin film is formed for approximately 10 to 50 seconds.

14. The method of claim 1, wherein a first thickness of the second thin film formed on the first thin film pattern is greater than a second thickness of the second thin film formed on the oxide film.

15. The method of claim 14, wherein the first thickness is about two to five times greater than the second thickness.

16. The method of claim 14, wherein the formation of the second thin film on the oxide film begins approximately 10 to 20 seconds after the formation of the second thin film on the first thin film pattern.

17. The method of claim 14, wherein the second thin film is formed for approximately 10 to 50 seconds.

18. The method of claim 1, wherein the second thin film is deposited in an airtight apparatus.

19. The method of claim 1, wherein the second thin film is deposited by a rapid thermal process.

20. A method for forming a gate electrode of a semiconductor device comprising the steps of:

forming a gate oxide film on a substrate;

successively forming a polysilicon film, a metal silicide film, and a silicon nitride film on the gate oxide film;

successively etching the polysilicon film, the metal silicide film, and the silicon nitride film to form a gate electrode pattern on the gate oxide film;

forming a thin film that includes nitride on the gate oxide film and on the gate electrode pattern; and re-oxidizing the gate oxide film to fix damage to the gate oxide film caused during the formation of the gate electrode pattern, wherein the thin film is selectively formed on the gate oxide film and on the gate electrode pattern, and the thin film on the gate oxide film has a deposition rate slower than that of the thin film on the gate electrode pattern.

21. The method of claim 20, further comprising the step of forming a spacer on a sidewall of the gate electrode pattern after the step re-oxidizing the gate oxide film.

22. The method of claim 20, wherein the thin film comprises a silicon nitride film.

23. The method of claim 20, wherein the thin film is deposited using an airtight apparatus.

24. The method of claim 20, wherein the thin film is deposited by a rapid thermal process.

25. The method of claim 20, wherein the gate oxide film is formed by a rapid thermal oxidation process.

26. A method for forming a transistor of a semiconductor device comprising the steps of:

forming a gate oxide film on a substrate;

successively forming a polysilicon film, a metal silicide film, and a silicon nitride film on the gate oxide film;

successively etching the polysilicon film, the metal silicide film, and the silicon nitride film to form a gate electrode on the gate oxide film;

forming a primary source/drain electrode at a portion of the substrate adjacent to the gate electrode by performing an ion implantation using the gate electrode as a mask;

continuously forming a thin film that includes nitride on the gate oxide film and on the gate electrode;

re-oxidizing the gate oxide film to fix a damage to the gate oxide film caused during the formation of the gate electrode;

forming a spacer on a sidewall of the gate electrode; and forming a source/drain electrode having a lightly doped drain structure at a portion of the substrate adjacent to the spacer by performing an ion implantation using the spacer as a mask, wherein the thin film is selectively formed on the gate oxide film and on the gate electrode, and the thin film on the gate oxide film has a deposition rate slower than that of the thin film on the gate electrode.

27. The method of claim 26, wherein the primary source/drain electrode is formed by implanting impurities into the substrate using the gate electrode as a mask.

28. The method of claim 26, wherein the source/drain electrode having a lightly doped drain structure is formed by implanting impurities into the substrate using the gate electrode and the spacer as masks.

29. A gate electrode of a semiconductor device comprising:

a substrate having a gate oxide film formed thereon;

a gate electrode pattern including a polysilicon pattern, a metal silicide pattern, and a silicon nitride pattern, the gate electrode pattern being formed on the gate oxide film; and a thin film that includes nitride, wherein the thin film is selectively formed on the gate oxide film and on the gate electrode pattern, and the thin film on the gate oxide film has a deposition rate slower than that of the thin film on the gate electrode pattern.

30. The gate electrode of claim 29, further comprising a spacer formed on a sidewall of the gate electrode pattern.

31. The gate electrode of claim 29, wherein the metal silicide includes at least one member selected from the group consisting of tungsten silicide, molybdenum silicide, titanium silicide and tantalum silicide.

32. A method of protecting a first thin film pattern on a substrate of a semiconductor device from an oxidation thereof comprising:

covering at least a portion of the first thin film pattern with a second thin film that includes nitride wherein a deposition rate of the second thin film enables the second thin film to deposit on the first thin film pattern without depositing on the substrate.

33. The method of claim 32, further comprising depositing an oxide film on said substrate before covering at least a portion of the first thin film pattern with the second thin film, wherein said first thin film pattern is formed on said oxide film.

34. A method of forming a semiconductor device comprising:

depositing an oxide film on a substrate;

forming a first thin film pattern having at least one oxidative material on the oxide film; and covering at least a portion of the first thin film pattern with a second thin film that includes nitride, wherein the second thin film on the first thin film pattern has a deposition rate faster than that of the second thin film on the oxide film.

* * * * *